United States Patent [19]
Mitsuyasu

[11] Patent Number: 5,208,505
[45] Date of Patent: May 4, 1993

[54] DEVICE FOR DRIVING A PIEZOELECTRIC ELEMENT

[75] Inventor: Masaki Mitsuyasu, Susono, Japan

[73] Assignee: Toyota Jidosha Kabushiki Kaisha, Toyota, Japan

[21] Appl. No.: 711,173

[22] Filed: Jun. 5, 1991

[30] Foreign Application Priority Data

Jun. 8, 1990 [JP] Japan ................... 2-148518

[51] Int. Cl.$^5$ .............................................. H01L 41/08
[52] U.S. Cl. ..................................... 310/317; 310/316
[58] Field of Search ................. 310/316, 317; 318/116

[56] References Cited

U.S. PATENT DOCUMENTS

| | | | |
|---|---|---|---|
| 4,404,502 | 9/1983 | Magori | 318/116 |
| 4,688,536 | 8/1987 | Mitsuyasu et al. | 310/317 |
| 4,732,129 | 3/1988 | Takigawa et al. | 310/316 |
| 4,767,959 | 8/1988 | Sakakibara et al. | 310/317 |
| 4,947,074 | 8/1990 | Suzuki | 310/316 |
| 4,966,119 | 10/1990 | Mitsuyasu et al. | 123/498 |
| 5,036,263 | 7/1991 | Yamada et al. | 318/116 |
| 5,053,668 | 10/1991 | Mitsuyasu | 310/317 |
| 5,057,734 | 10/1991 | Tsuzuki et al. | 310/317 |

FOREIGN PATENT DOCUMENTS 0371469 11/1989 European Pat. Off. .
62-117250 7/1987 Japan .
62-117251 7/1987 Japan .

OTHER PUBLICATIONS

Copending U.S. Application No. 295296 (filing date: Jan. 10, 1989).
Copending U.S. Application No. 461236 (filing date: Jan. 5, 1990).

Primary Examiner—Mark O. Budd
Assistant Examiner—Thomas M. Dougherty
Attorney, Agent, or Firm—Kenyon & Kenyon

[57] ABSTRACT

A piezoelectric element drive device comprising a power condenser for charging the piezoelectric element. The discharging circuit for the piezoelectric element comprises a first discharging circuit having a discharging coil therein and connected to the ground, and a second discharging circuit having a discharging coil and connected to the power condenser. When the discharging operation of the piezoelectric element is started, the piezoelectric element is initially discharged to the ground via the first discharging circuit, and then the piezoelectric element is discharged to the power condenser via the second discharging circuit, to charge the power condenser.

20 Claims, 11 Drawing Sheets

DEVICE FOR DRIVING A PIEZOELECTRIC ELEMENT

BACKGROUND OF THE INVENTION

1. Field of the Invention

The present invention relates to a device for driving a piezoelectric element.

2. Description of the Related Art

A well known device for charging and discharging a piezoelectric element is adapted to charge an electric charge to a power condenser of a piezoelectric element through a charging coil, and discharge the electric charge in the piezoelectric element through a discharging coil, but this device has a problem such that the discharged electric charge is wastefully consumed.

To solve the above problem, a device for charging and discharging a piezoelectric element is known in which a part of the discharged electric charge is recovered by a power condenser, to reduce the power consumption (refer to Japanese utility model publication No. 62-117251).

The above device for charging and discharging a piezoelectric element, in principle, comprises a first discharging circuit for discharging an electric charge in a piezoelectric element PZT to the ground through a discharging coil L2, and a second discharging circuit for discharging an electric charge in the piezoelectric element PZT to a high potential side of a power condenser C, through the discharging coil L2, as shown in FIG. 10. The power condenser C is charged by a high voltage generator E, and when a switching means S1 is turned ON, the electric charge in the power condenser C is charged to the piezoelectric element PZT through a charging coil L1. During a discharging operation, a switching means S3 is initially turned ON and the electric charge in the piezoelectric element PZT is discharged through the second discharging circuit, so that the discharged electric charge is recovered by the power condenser C. Then, the switching means S3 is turned OFF and a switching means S2 is turned ON, so that the electric charge in the piezoelectric element PZT is discharged through the first discharging circuit. Accordingly, since the power condenser C is thus charged not only by the high voltage generator E but also by the discharged electric charge, the power consumption can be reduced.

When the terminal voltage of the piezoelectric element PZT during the discharging operation becomes a high negative voltage, the polarization state of the piezoelectric element PZT is changed, the amount of expansion of the piezoelectric element is reduced, and the piezoelectric element is heated whereby the polarization becomes poor. Therefore, it is necessary to control the terminal voltage of the piezoelectric element PZT during the discharging operation so that a high negative voltage does not occur. Further, since the amount of expansion of the piezoelectric element PZT can be controlled by the terminal voltage of the piezoelectric element PZT during the discharging operation, preferably the terminal voltage of the piezoelectric element PZT is freely set during the discharging operation. Nevertheless, although the device for charging and discharging a piezoelectric element as disclosed in the above Japanese Unexamined Utility Model Publication No. 62-117251 can to a certain extent prevent the terminal voltage of the piezoelectric element PZT from becoming a negative voltage during a discharging operation, it cannot completely prevent this phenomenon. Namely this device has less control of the terminal voltage of the piezoelectric element, during the discharging operation, to thus obtain a predetermined positive voltage. This problem will be further discussed with reference to FIG. 10 and FIGS. 11(A) to 11(F).

In FIG. 10, the electrostatic capacity of the power condenser C is much larger than that of the piezoelectric element PZT, and the high voltage generator E generates a voltage as high as 320 (V). The terminal voltage of a high potential side of the power condenser C is, therefore, substantially 320 (V), and when the switching means S1 is turned ON in this state, the piezoelectric element PZT is charged and the terminal voltage of the piezoelectric element PZT becomes as high as 600 (V). In such a condition, the switching element S3 is initially turned ON, and then the switching element S2 is turned ON, and thereafter, a discharging operation is started. The change of the terminal voltage of the piezoelectric element PZT at this time is shown in FIGS. 11(A), 11(B) and 11(C).

FIG. 11(A) shows a state wherein the switching element S3 is turned ON for a short time. When the switching element S3 is turned on, the electric charge in the piezoelectric element PZT is recovered by the power condenser C through the second discharging circuit, but since the switching means S3 is turned ON for only a short time, there is little drop in the terminal voltage V of the piezoelectric element PZT during this time. Then, when the switching means S3 is turned OFF and the switching means S2 is turned ON, the electric charge in the piezoelectric element PZT is discharged through the first discharging circuit, and since the piezoelectric element PZT and the discharging coil L2 constitute a resonance circuit at this time, the terminal voltage V of the piezoelectric element PZT after the discharging operation is completed becomes a negative voltage. The magnitude of the negative voltage is almost ⅓ of the terminal voltage V (positive voltage) of the piezoelectric element PZT when the switching means S2 is turned ON and the discharging operation is started in the first discharging circuit. Namely, as exemplified in FIG. 11(A), since the terminal voltage V of the piezoelectric element PZT when the switching means S2 is turned ON is slightly lower than 600 (V), the terminal voltage of the piezoelectric element PZT after the discharging operation is completed becomes substantially −200 (V).

FIG. 11(B) shows an example wherein the switching means S3 is turned ON for a longer time, i.e., where the switching means S3 is turned OFF and the switching means S2 is turned ON when the terminal voltage V of the piezoelectric element PZT drops to as low as 400 (V). In this case, the negative voltage generated in the terminal of the piezoelectric element PZT after the discharging operation is completed is slightly lower, at approximately −150 (V).

FIG. 11(C) shows an example wherein the switching means S3 is turned ON until the discharging operation through the second discharging circuit is completed, and thereafter, the switching means S2 is turned ON. When the switching means S3 is turned ON, the piezoelectric element PZT, the power condenser C and the discharging coil L2 constitute a resonance circuit, and at this time, the terminal voltage of the piezoelectric element PZT after the discharging operation is completed is also lower by about ⅓ of the terminal voltage V of the piezoelectric element PZT when the discharging operation is started, where the terminal voltage (approximately 320 (V)) of a high potential side of the power condenser C is taken as a reference, than the terminal voltage of a high potential side of the power condenser C. Namely, since the terminal voltage V of the piezoelectric element PZT where the terminal voltage of a high potential side of the power condenser C when the discharging operation is started is regarded as a reference is approximately 300 (V), the terminal voltage V of the piezoelectric element PZT after the discharging operation is completed becomes approximately 200 (V), and as long as the switching means S2 is not turned ON, the terminal voltage V of the piezoelectric element PZT is maintained at approximately 200 (V). FIG. 11(C) shows an example wherein the switching means S2 is turned ON when the terminal voltage V of the piezoelectric element falls to approximately 200 (V). In this case also, the negative voltage generated in the terminal of the piezoelectric element PZT after the discharging operation is finished becomes approximately ¼ of the terminal voltage V of the piezoelectric element PZT at the time of the start of the discharging operation, and therefore, the negative voltage generated at the terminal of the piezoelectric element PZT after the completion of the discharging operation is as low as −80 V. In this case, if the switching means S2 is turned OFF before the discharging operation is completed, i.e., if the ON time of the switching means S2 is short, energy stored in the discharging coil L2 is abruptly discharged when the switching means S2 is turned OFF, and thus the switching means S2 is damaged. Namely, the switching means S2 cannot be, thus turned OFF until the discharging operation is completed, and thus the terminal voltage V of the piezoelectric element PZT after the discharging operation is completed becomes approximately −80 (V). Accordingly, if the electric charge charged in the piezoelectric element PZT is discharged through the second discharging circuit, and then discharged through the first discharging circuit, the terminal voltage V of piezoelectric element PZT after the completion of the discharging operation cannot be maintained at a negative voltage lower than approximately −80 (V), and further, cannot be maintained at a constant positive voltage.

Nevertheless, if, after the electric charge in the piezoelectric element PZT is discharged through the first discharging circuit it is discharged through the second discharging circuit, the terminal voltage V of the piezoelectric element PZT can be set at any voltage between −200 (V) and +200 (V). This will be now explained with reference to FIGS. 11D, 11E and 11F. Namely, when the switching means S2 is turned ON, the discharge of the electric charge in the piezoelectric element PZT is started through the first discharging circuit, and therefore, the terminal voltage V of the piezoelectric element PZT begins to drop. Then, when the switching means S2 is turned OFF and the switching means S3 is turned ON, the discharging operation is started through the second discharging circuit.

As shown in FIG. 11(D), when the ON time of the switching means S2 is short, the result is equal to that obtained when only the switching means S3 is turned ON. Accordingly, at this time, the terminal voltage V of the piezoelectric element PZT after the completion of the discharging operation becomes as high as 200 (V), as explained with reference to FIG. 11(C).

On the other hand, when the ON time of the switching means S2 is made longer, the result is equal to that obtained from the example shown in FIG. 11(A), and at this time, the terminal voltage V of the piezoelectric element PZT after the completion of the discharging operation becomes approximately −200 (V).

Next, an example wherein the ON time of the switching means S3 is between the short and long times will be described. This case is more easily explained by using energy, as an example, and thus the following will be based on energy.

When the switching means S2 is turned ON and the discharge of the electric charge in the piezoelectric element PZT is started, the piezoelectric element PZT continues to emit energy and the terminal voltage V of the piezoelectric element PZT continues to fall. When the piezoelectric element PZT begins to emit energy, a current is to flow caused continuously through the discharging coil L2 in the direction shown by arrows indicating the first discharging circuit, and this energy is gradually accumulated in the discharging coil L2. Then, when the switching means S2 is turned OFF and the switching means S3 is turned ON, the energy accumulated in the discharging coil L2 is applied to the power condenser C via the second discharging circuit, and thus the power condenser C is charged. Since the current is caused to flow continuously through the discharging coil L2 for sometime after the switching means S2 is turned OFF and the switching means S3 is turned ON, the terminal voltage V of the piezoelectric element PZT continuous to fall. Then, when the flow of current through the discharging coil L2 is stopped, i.e., when the discharging operation is completed, the terminal voltage V of the piezoelectric element PZT becomes a constant voltage. Namely, as shown in FIGS. 11(E) and 11(F), the terminal voltage V of the piezoelectric element PZT when the discharging operation is completed is changed in accordance with the ON time of the switching means S2; the longer the ON time of the switching means S2, the lower the terminal voltage V of the piezoelectric element PZT. In this case, the terminal voltage V of the piezoelectric element PZT, after the discharging operation is completed, can be changed within a range of from −200 (V) to +200 (V) by changing the ON time of the switching means S2.

SUMMARY OF THE INVENTION

An object of the present invention is to provide a device for driving a piezoelectric element in which the terminal voltage of the piezoelectric element can be changed over a wide range after a discharging operation is completed.

According to the present invention, there is provided a device for driving a piezoelectric element, comprising: a power condenser having a high voltage side terminal; first switching means connected between the piezoelectric element and the high voltage side terminal of the power condenser for charging the piezoelectric element by using a high potential at the high voltage side terminal of the power condenser; a first discharging circuit having a discharging coil therein and connected between the piezoelectric element and the ground for discharging the piezoelectric element to the ground via the first discharging circuit; a second discharging circuit having a discharging coil therein and connected between the piezoelectric element and the high voltage side terminal of the power condenser for discharging the piezoelectric element to the high voltage side terminal of the power condenser via the second discharging circuit; and discharge control means for discharging the piezoelectric element to the high voltage side terminal of the power condenser via the second discharging circuit after discharging the piezoelectric element to the ground via the first discharging circuit.

The present invention may be more fully understood from the description of preferred embodiments of the present invention set forth below, together with the accompanying drawings.

DESCRIPTION OF PREFERRED EMBODIMENTS

The present invention will be described by exemplifying a device for driving a piezoelectric element for controlling fuel injection.

First, a fuel injection valve using a piezoelectric element will be described with reference to FIG. 9.

Figure 9:
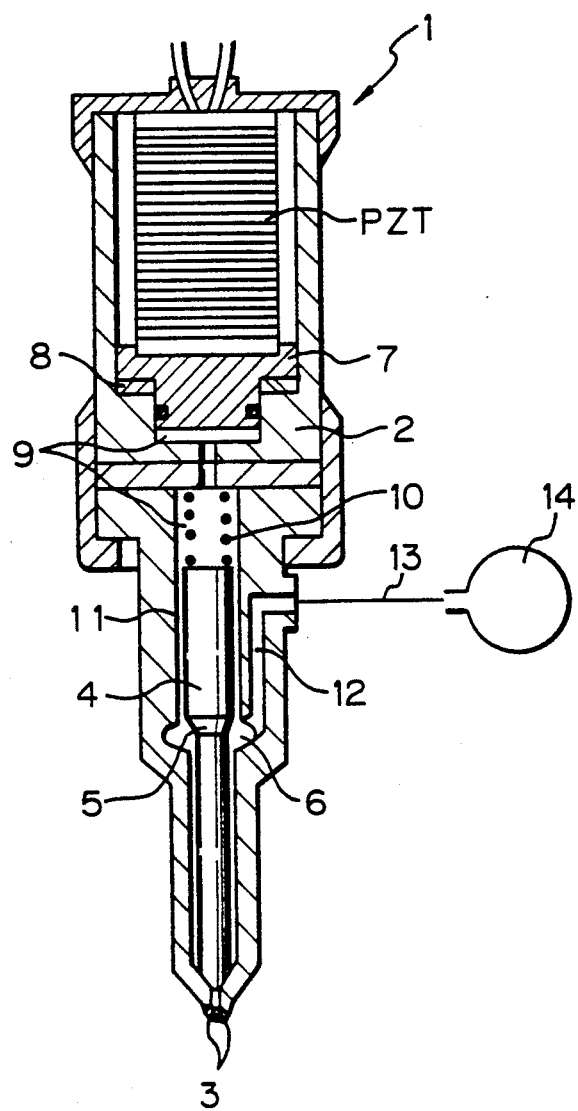
FIG. 9 is a side sectional view of a fuel injection valve.

As shown in FIG. 9, a fuel injection valve 1 comprises a needle 4 sliding inserted into a housing 2, to control the opening and closing of a nozzle port 3, a needle pressuring chamber 6 formed on the circumference of a conical pressure receiving face 5 of the needle 4, a piston 7 slidingly inserted into the housing 2, a piezoelectric element PZT inserted between the housing 2 and the piston 7, a disk spring 8 biasing the piston 7 toward the piezoelectric element PZT, a pressure control chamber 9 formed between the needle 4 and the piston 7, and a compression spring 10 biasing the needle 4 toward the nozzle port 3. The pressure control chamber 9 is connected to the needle pressuring chamber 6 through a restriction passage 11 formed on the circumference of the needle 4, and the needle pressurizing chamber 6 is connected to an accumulator 14 filled with high pressure fuel through a fuel passage 12 and a fuel distribution pipe 13. The high pressure fuel in the accumulator 14 is conducted to the needle pressurizing chamber 6, and a part of the high pressure fuel is fed to the pressure control chamber 9 through the restriction passage 11, and thus the fuel pressure in the needle pressurizing chamber 6 and the pressure control chamber 9 is substantially equal to the high pressure in the accumulator 14.

When electric charge in the piezoelectric element PZT is discharged and the piezoelectric element is contracted, the piston 7 is raised, and therefore, the fuel pressure in the pressure control chamber 9 is abruptly lowered, and as a result, the needle 4 is raised and the injection of fuel from the nozzle port 3 is started. While the fuel injection is carried out, the fuel in the needle pressurizing chamber 6 is fed to the pressure control chamber 9 through the restriction passage 11, so that the fuel pressure in the pressure control chamber 9 is gradually increased. Then, when the electric charge is charged in the piezoelectric element PZT and the piezoelectric element PZT is expanded, the piston is lowered, and therefore, the fuel pressure in the pressure control chamber 9 is quickly increased, and as a result, the needle 4 is lowered to close the nozzle port 3 and stop the fuel injection. Since the fuel in the pressure control chamber 9 flows into the needle pressurizing chamber 6 through the restriction passage 11, while the fuel injection is stopped, the fuel pressure in the pressure control chamber 9 gradually falls and returns to the original high pressure.

The device for driving the piezoelectric element PZT shown in FIG. 9 will be described with reference to FIG. 1.

Figure 1:
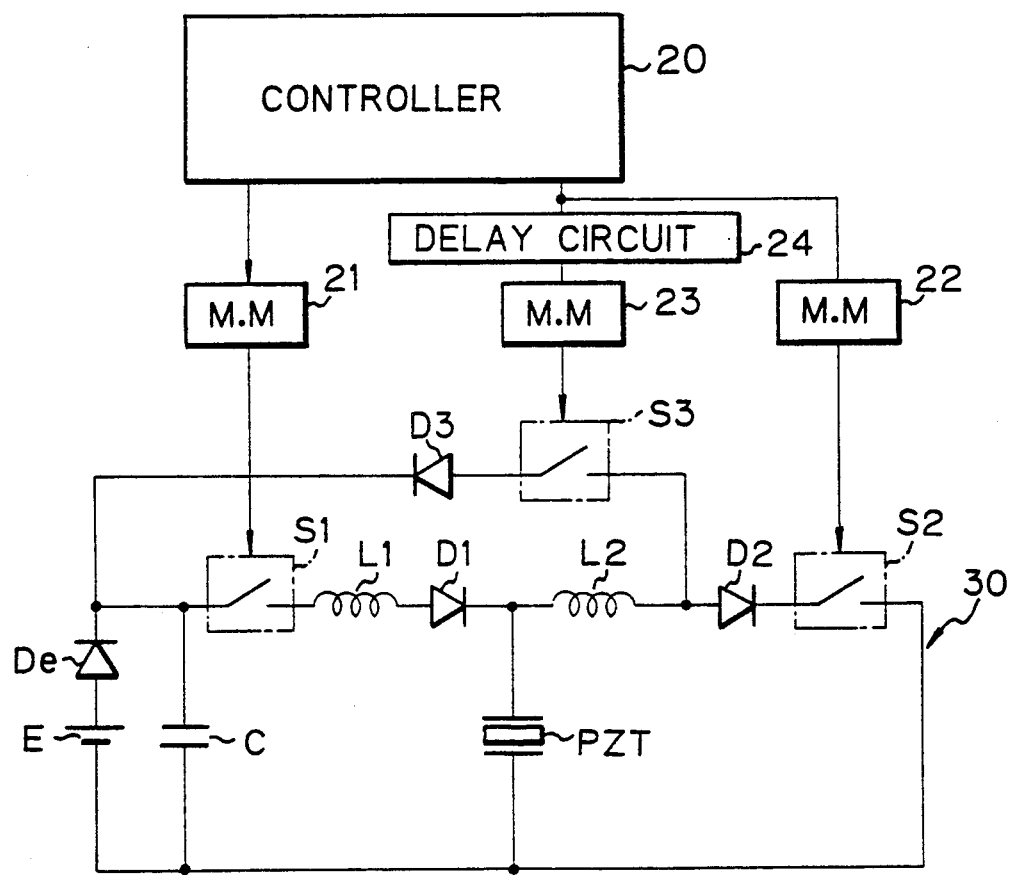
FIG. 1 is a circuit diagram for driving a piezoelectric element according to a first embodiment of the invention.
Figure 10:
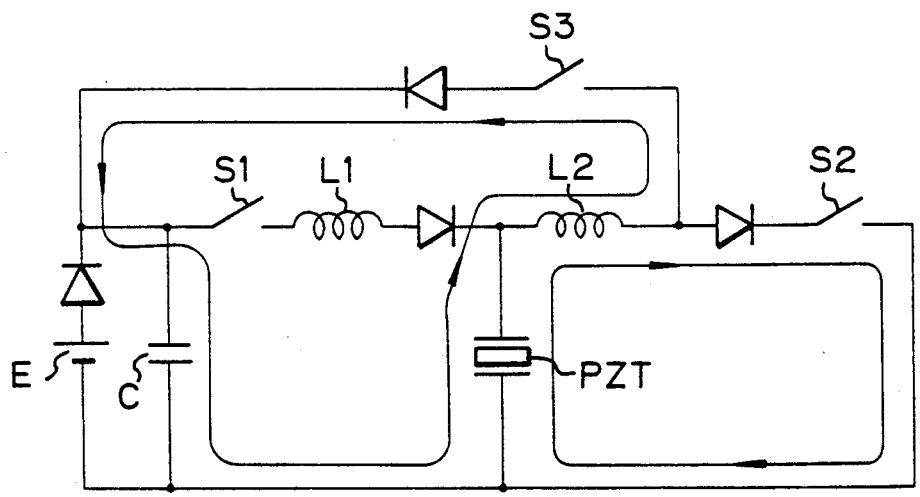
FIG. 10 is a circuit diagram for driving the piezoelectric element, and explaining the difference on the discharging operations in accordance with the difference in the discharging circuits.

FIG. 1 shows a device 30 for driving a piezoelectric element PZT controlled by a controller 20, and as shown in FIG. 1, a high potential side of a high voltage generator E is connected to a high potential side of a power condenser C through a diode De, whereby the power condenser C is charged by the high voltage generator E through the diode De. The high potential side of the power condenser C is connected to a terminal of the piezoelectric element PZT through a switching means S1, a charging coil L1 and a diode D1, and the node of the diode D1 and the terminal of the piezoelectric element PZT are connected to the ground through a discharging coil L2, a diode D2, and a switching means S2. The node of the discharging coil L2 and the diode D2 are connected to the node of the diode De and the power condenser C through a switching means S3 and a diode D3. The electrostatic capacity of the power condenser C is extremely larger than that of the piezoelectric element PZT. In the embodiment shown in FIG. 1, the high voltage generator E generates a voltage as high as 320 (V), and accordingly, the voltage at the high potential side of the power condenser C is approximately 320 (V). As can be seen from FIG. 1 and FIG. 10, the device 30 for driving the piezoelectric element is the same as that shown in FIG. 10. Therefore, in FIG. 1, the discharging coil L2, the diode D2 and the switching means S2 constitute a first discharging circuit, and the discharging coil L2, the switching means S3 and the diode D3 constitute a second discharging circuit.

The controller 20 includes three monostable multivibrators 21, 22 and 23 and a delay circuit 24 connected to the input terminal of the multivibrator 23, and the respective switching means S1, S2 and S3 are controlled by signals output by the corresponding monostable multivibrators 21, 22 and 23. The controller 20 outputs an injection start pulse and an injection completion pulse; the monostable multivibrator 21 being actuated by the injection completion pulse, and the monostable multivibrator 22 and the delay circuit 24 being actuated by the injection start pulse. The multivibrator 23 is actuated by the signal output from the delay circuit 24 after a fixed time determined by the delay circuit 24 has elapsed after the controller 20 outputs the injection start pulse.

A case wherein the operation of the piezoelectric element PZT is started from a state in which the piezoelectric element PZT is being charged will be now described with reference to FIG. 2.

Figure 2:
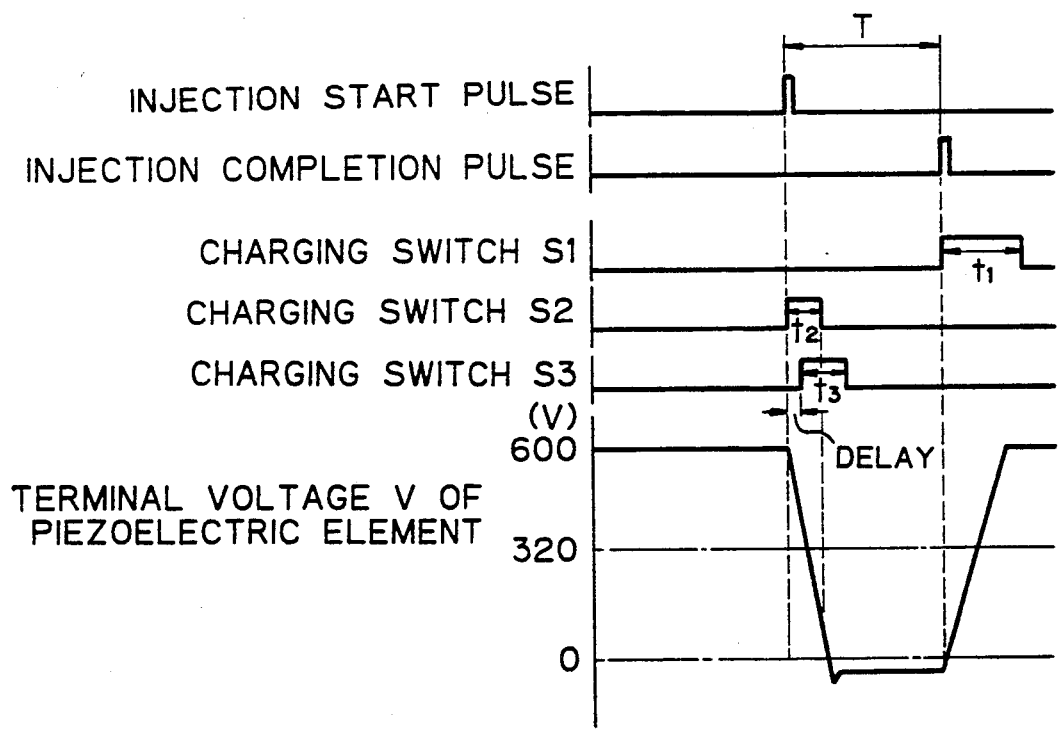
FIG. 2 is a time chart.

As shown in FIG. 2, when the controller 20 outputs the injection start pulse, the output voltage of the monostable multivibrator 22 reaches a high level, and then the output voltage of the monostable multivibrator 23 reaches a high level after a delay. As a result, the switching means S2 is turned ON, and then the switching means S3 is turned ON after a delay. The output voltage of the monostable multivibrator 22 reaches a low level after a predetermined time $t_2$ has passed, and therefore, the switching means S2 is turned ON only for a time $t_2$. The output voltage of the monostable multivibrator 23, however, reaches a low level after a predetermined time $t_3$ has passed, which time $t_3$ is longer than the time $t_2$, and therefore the switching means S3 is turned ON for only a time $t_3$.

When the switching means S2 is turned ON, the voltage at the node of the discharging coil L2 and the diode D2 is abruptly lowered, and thus the discharge of the electric charge in the piezoelectric element PZT is started. Then, the switching means S3 is turned ON. At this time, however, a discharge current does not flow through the switching means S3, but only through the switching means S2. Namely, the electric charge in the piezoelectric element PZT is discharged to the ground through the first discharging circuit comprising the discharging coil L2, the diode D2 and the switching means S2, and as a result, the terminal voltage V of the piezoelectric element PZT gradually falls. Then, when the switching means S2 is turned OFF, energy accumulated in the discharging coil L2 is supplied to the power condenser C through the switching means S3 and the diode D3, i.e., the electric charge in the piezoelectric element PZT is discharged to the high potential side of the power condenser C via the second discharging circuit comprising the discharging coil L2, the switching means S3 and the diode D3, and consequently, a part of the discharge current is recovered by the power condenser C. When the discharging operation of the piezoelectric element PZT is completed, the terminal voltage V of the piezoelectric element PZT is maintained at a constant voltage, and thereafter, the switching means S3 is turned OFF. Namely, the time $t_3$ is determined such that the switching means S3 is turned OFF after the discharging operation is completed.

When an injection time T has passed after the injection start pulse is output, the injection completion pulse is output, and when the injection completion pulse is output, the output voltage of the monostable multivibrator 21 reaches a high level for a predetermined time $t_1$, and as a result, the switching means S1 is turned ON only for the time $t_1$. When the switching means S1 is turned ON, the electric charge in the power condenser C is charged to the piezoelectric element PZT through the switching means S1, the charging coil L1 and the diode D1.

Figure 11A:
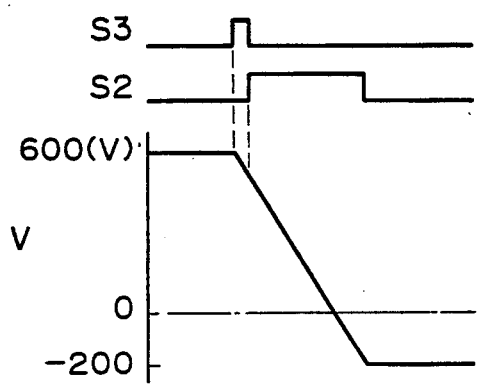
FIGS. 11(A) to 11(F) are diagrams showing the change of the terminal voltage of the piezoelectric element during the discharging operation.
Figure 11D:
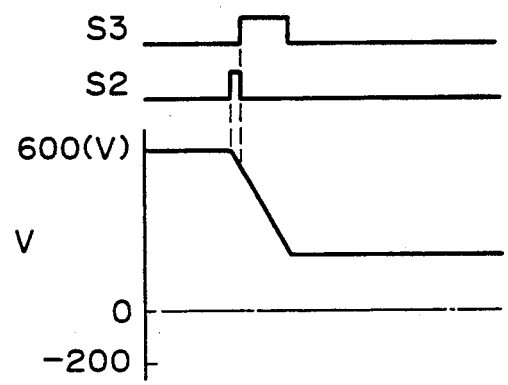
Figure 11B:
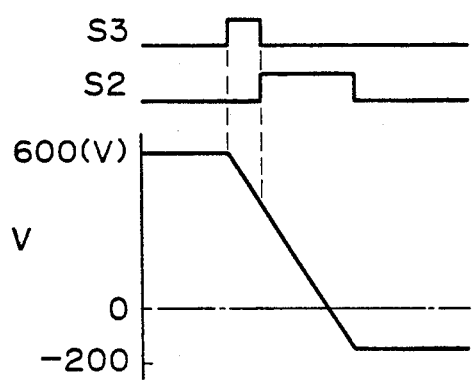
Figure 11E:
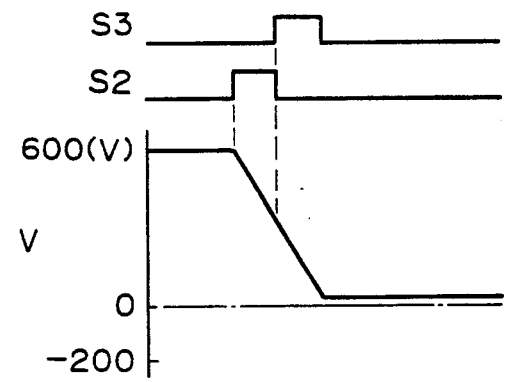
Figure 11C:
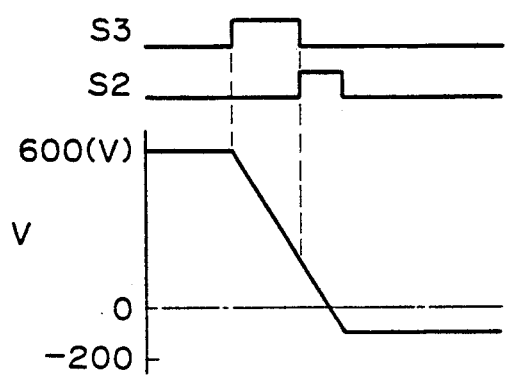
Figure 11F:
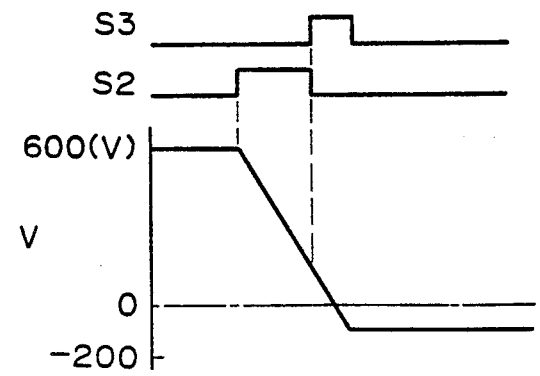

As shown in FIG. 2, the embodiment shown in FIG. 1 illustrates an example wherein the terminal voltage of the piezoelectric element PZT becomes approximately −60 (V) after the discharging operation is completed, but as mentioned before with reference to FIGS. 11D, 11E and 11F, the terminal voltage V of the piezoelectric element PZT after the completion of the discharging operation can be freely changed by changing the ON time $t_2$ of the switching means S2, within a range of from −200 (V) to +200 (V). Namely, in the embodiment shown in FIG. 1, the terminal voltage V of the piezoelectric element PZT after the completion of the discharging operation can be changed over a wide range of negative voltage or positive voltage in accordance with the change of the time $t_2$ determined by the monostable multivibrator 22.

Figure 3:
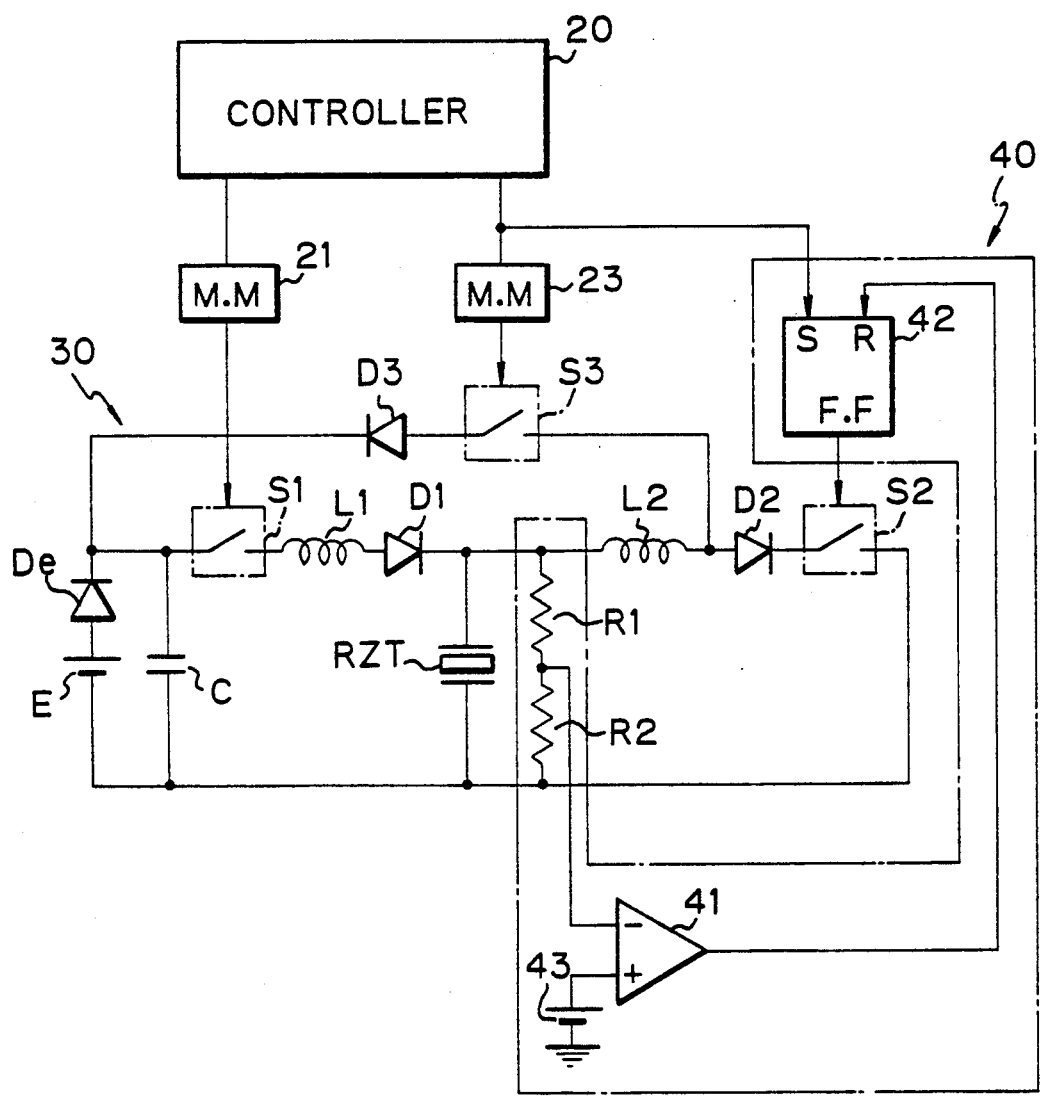
FIG. 3 is a circuit diagram for driving the piezoelectric element according to a second embodiment of the invention.

FIG. 3 shows a second embodiment, wherein a control circuit 40 surrounded by chain lines is added to the device 30 for driving the piezoelectric element PZT shown in FIG. 1. This control circuit 40 comprises a pair of series resistances $R_1$ and $R_2$, a comparator 41 and a bistable multivibrator 42. The switching means S2 is controlled by the output signal of the bistable multivibrator 42, and the node of the resistances $R_1$ and $R_2$ is connected to a reversing input terminal of the comparator 41. A non-reversing input terminal of the comparator 41 is connected to a reference power source 43, and an output terminal of the comparator 41 is connected to a reset input terminal R of the bistable multivibrator 42. The injection start pulse is input to a set input terminal S of the bistable multivibrator 42. The operation of the device for driving the piezoelectric element shown in FIG. 3 will be described with reference to FIG. 4.

Figure 4:
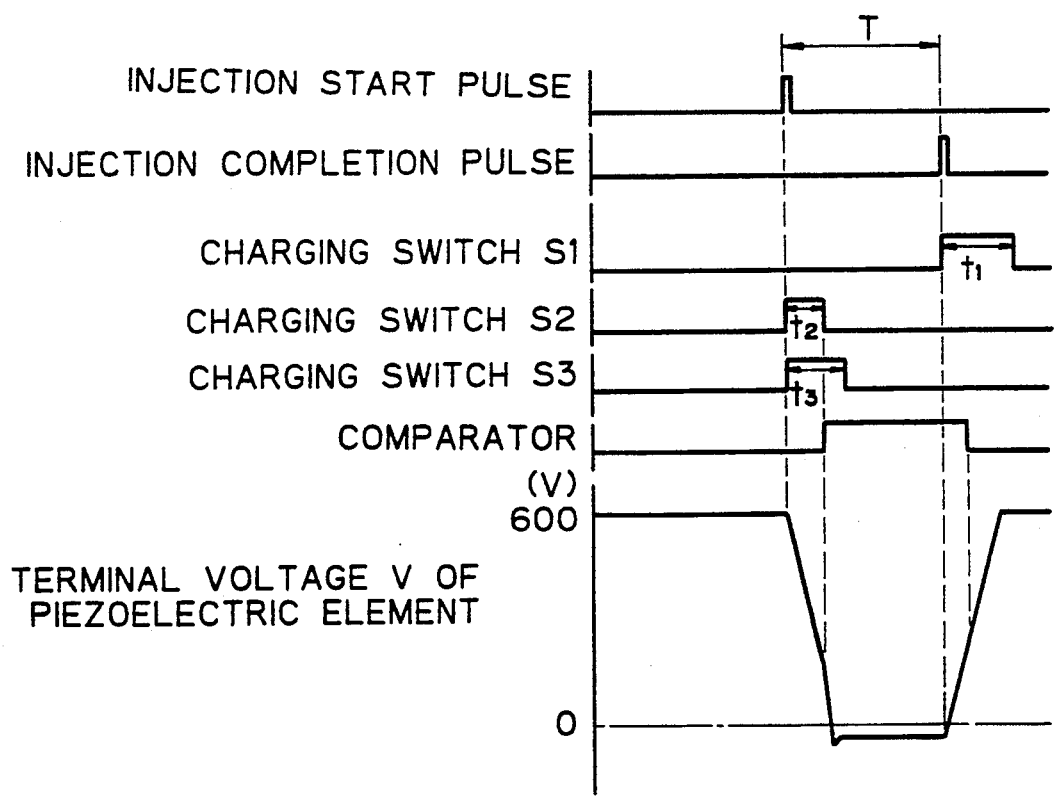
FIG. 4 is a time chart.

As shown in FIG. 4, when the injection start pulse is output, the output voltage of the bistable multivibrator 42 reaches a high level and the switching means S2 is turned ON, and at the same time, the output voltage of the monostable multivibrator 23 reaches a high level and the switching means S3 is turned ON. Then, the output voltage V of the piezoelectric element PZT falls, and thus the voltage at the node of the resistances $R_1$ and $R_2$ falls and becomes lower than the reference voltage of the reference power source 43, and therefore, the output voltage of the comparator 41 reaches a high level. When the output voltage of the comparator 41 reaches the high level, it becomes a trigger. Therefore, the output voltage of the bistable multivibrator 42, reaches a low level and the switching means S2 is turned OFF. Accordingly, in this embodiment, the ON time $t_2$ of the switching means S2 is determined by the reference voltage of the reference power source 43. Namely, in this embodiment, the output voltage V of the piezoelectric element PZT after the completion of the discharging operation can be arbitrarily changed within a range of from −200 (V) to +200 (V), by changing the reference voltage of the reference power source 43.

Figure 5:
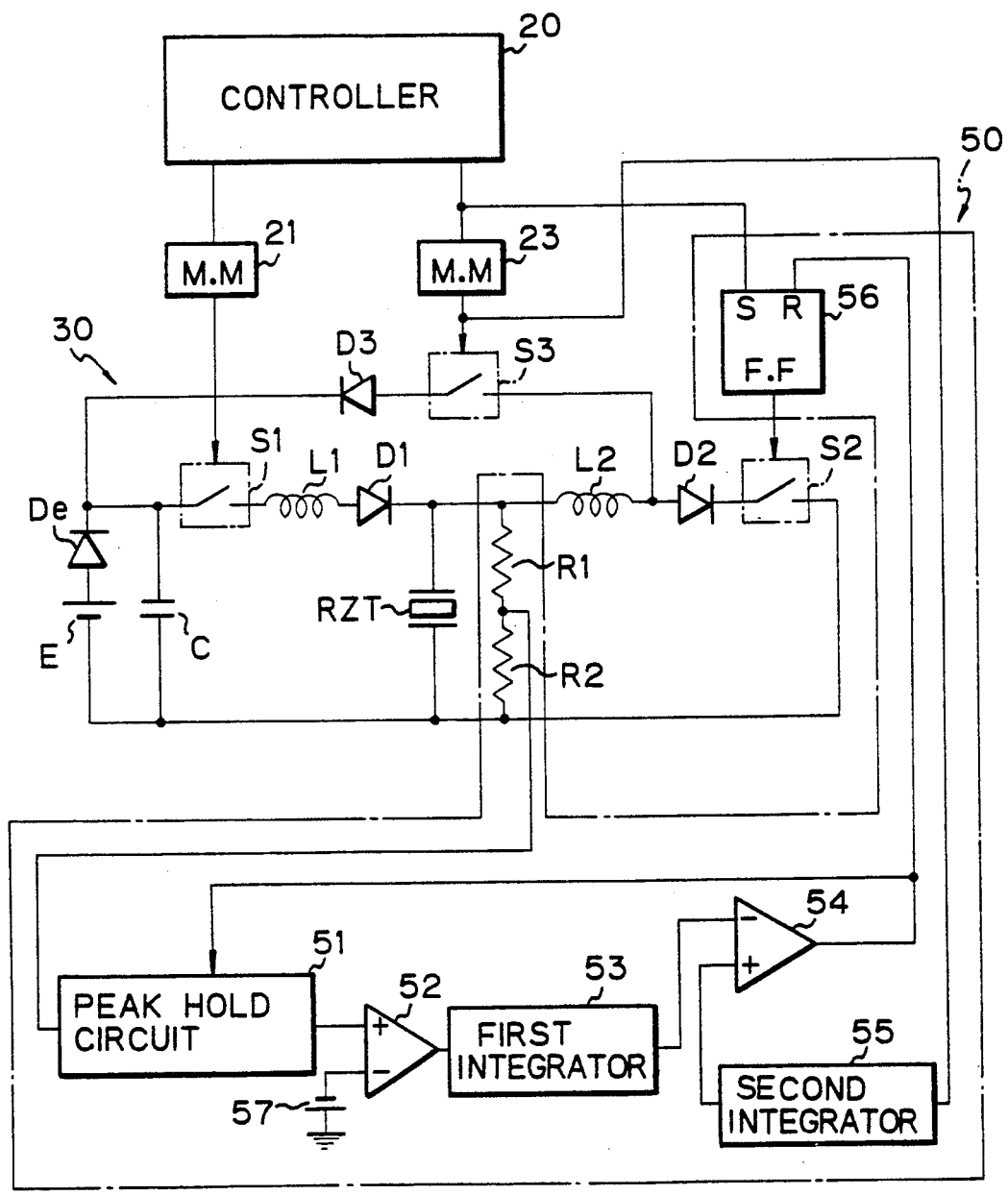
FIG. 5 is a circuit diagram for driving the piezoelectric element according to a third embodiment of the invention.

A third embodiment of the present invention is shown in FIG. 5. In this embodiment, a control circuit 50 surrounded by chain lines is added to the device 30 for driving the piezoelectric element shown in FIG. 1. The control circuit 50 comprises a pair of series resistances $R_1$ and $R_2$ connected in parallel with the piezoelectric element PZT, a minimum peak hold circuit 51, a first comparator 52, a first integrator 53, a second comparator 54, a second integrator 55 and a bistable multivibrator 56. The switching means is controlled by the output signal of the bistable multivibrator 56, the node of the resistances $R_1$ and $R_2$ is connected to an input terminal of the minimum peak hold circuit 51, an output terminal of the minimum peak hold circuit 51 is connected to a non-reversing input terminal of the first comparator 52, a reversing input terminal of the first comparator 52 is connected to a reference power source 57, an output terminal of the first comparator 52 is connected to a reversing input terminal of the second comparator 54 through the first integrator 53, an output terminal of the monostable multivibrator 23 is connected to a non-reversing input terminal of the second comparator 54 through the second integrator 55, and an output terminal of the second comparator 54 is connected to a reset input terminal R of the bistable multivibrator 56 and the minimum peak hold circuit 51. The injection start pulse is input to a set input terminal S of the bistable multivibrator 56.

Figure 6:
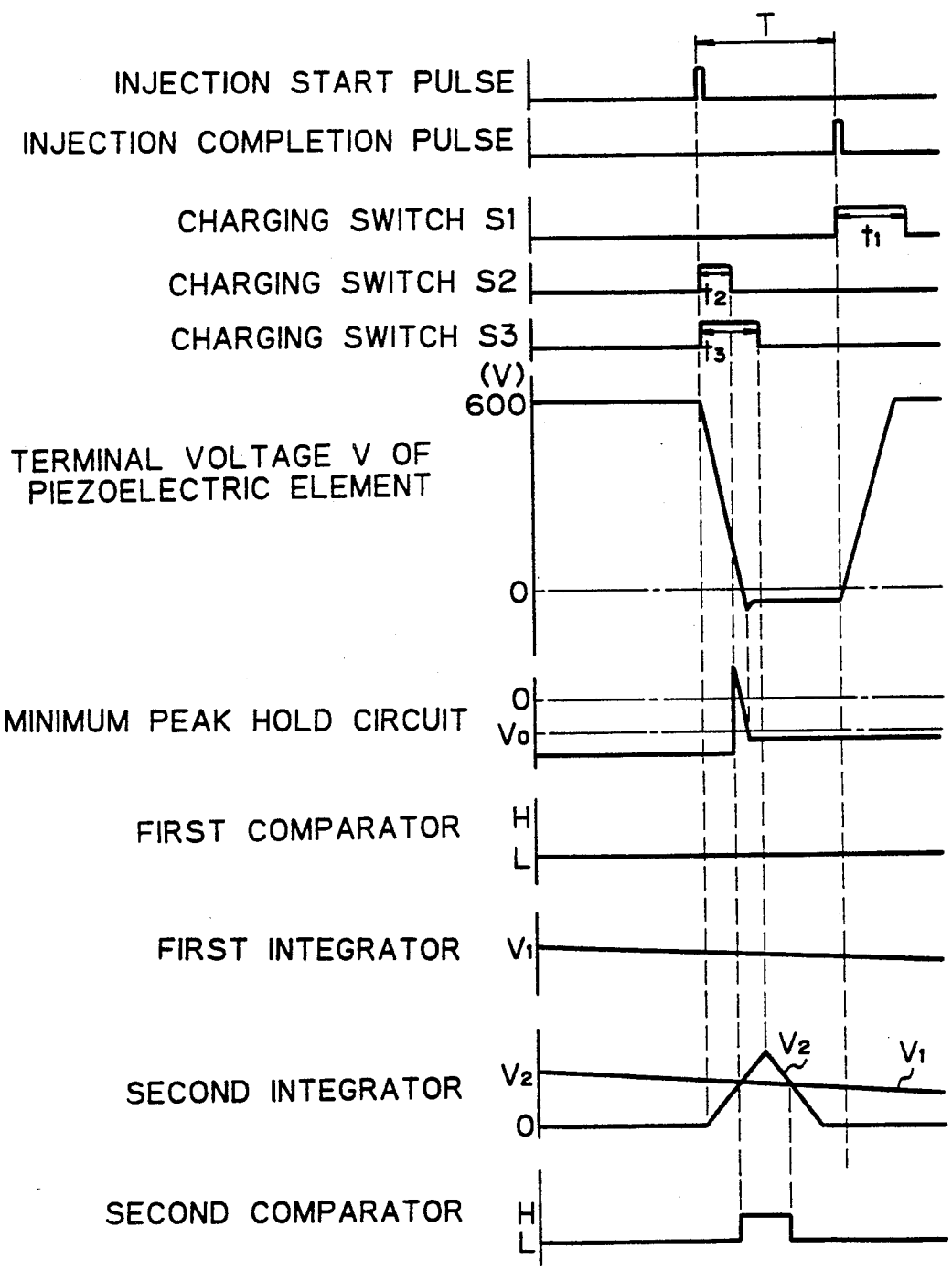
FIG. 6 is a time chart.

The operation of the device for driving the piezoelectric element shown in FIG. 5 will be described with reference to FIG. 6.

As shown in FIG. 4, when the injection start pulse is output, the output voltage of the bistable multivibrator 56 reaches a high level and the switching means S2 is turned ON, and at the same time, the output voltage of the monostable multivibrator 23 reaches a high level and the switching means S3 is turned ON. When the output voltage of the monostable multivibrator 23 reaches the high level, the output voltage $V_2$ of the second integrator 55 begins to increase, and when the output voltage V of the piezoelectric element PZT falls and the output voltage $V_2$ of the second integrator 55 becomes higher than the output voltage $V_1$ of the first integrator 53, the output voltage of the second comparator 54 reaches a high level. When the output voltage of the comparator 54 reaches the high level, which is a trigger, the output voltage of the bistable multivibrator 42 reaches a low level and the switching means S2 is turned OFF, and simultaneously, the minimum peak hold circuit 51 is reset.

When the discharging operation of the piezoelectric element PZT is completed and the terminal voltage of the piezoelectric element PZT reaches a lowest level, the minimum terminal voltage V of the piezoelectric element PZT is held by the minimum peak hold circuit 51, and the minimum peak hold circuit 51 outputs the minimum terminal voltage V of the piezoelectric element PZT. When the output voltage of the minimum peak hold circuit 51 is higher than the reference voltage $V_o$ of the reference power source 57, the output voltage of the first comparator 52 reaches a high level, but when output voltage of the minimum peak hold circuit 51 is lower than the reference voltage $V_o$, the output voltage of the first comparator 52 reaches a low level. The output voltage of the first comparator 52 is integrated by the first integrator 53 and the result is applied to the reversing input terminal of the second comparator 54. When the minimum terminal voltage V of the piezoelectric element PZT is lower than the reference voltage $V_o$, the output voltage of the first comparator 52 reaches a low level, and therefore, the output voltage of the first integrator 53 gradually falls. When the output voltage of the first integrator 53 falls, the ON time $t_2$ of the switching means S2 is short, and thus the minimum terminal voltage V of the piezoelectric element PZT is increased. On the other hand, when the minimum terminal voltage V of the piezoelectric element PZT is higher than the reference voltage $V_o$, the output voltage of the first comparator 52 reaches a high level, and therefore, the output voltage of the first integrator 53 gradually increases. When the output voltage of the first integrator 53 increases, the ON time $t_2$ of the switching means S2 becomes longer, and thus the minimum terminal voltage V of the piezoelectric element PZT falls. Accordingly, the minimum terminal voltage V of the piezoelectric element PZT can be made to precisely coincide with the reference voltage $V_o$. Namely, in this embodiment, the minimum terminal voltage V of the piezoelectric element PZT can be made to precisely coincide with a desired voltage located within a range of from $-200$ (V) to $+200$ (V), which corresponds to the reference voltage $V_o$, by changing the reference voltage $V_o$ within a range of from $-200$ (V) to $+200$ (V).

Figure 7:
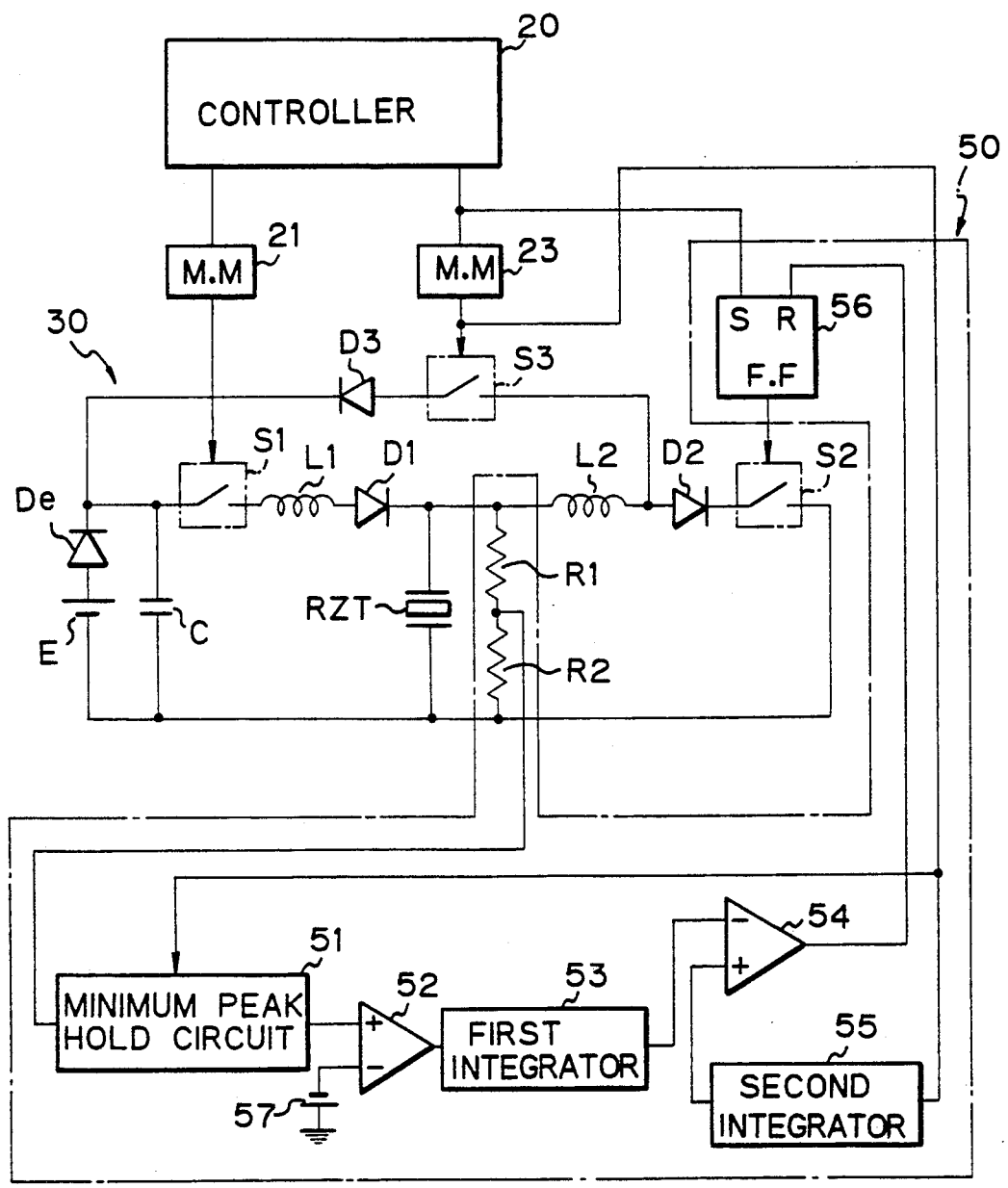
FIG. 7 is a circuit diagram for driving the piezoelectric element according to a fourth embodiment of the invention.
Figure 8:
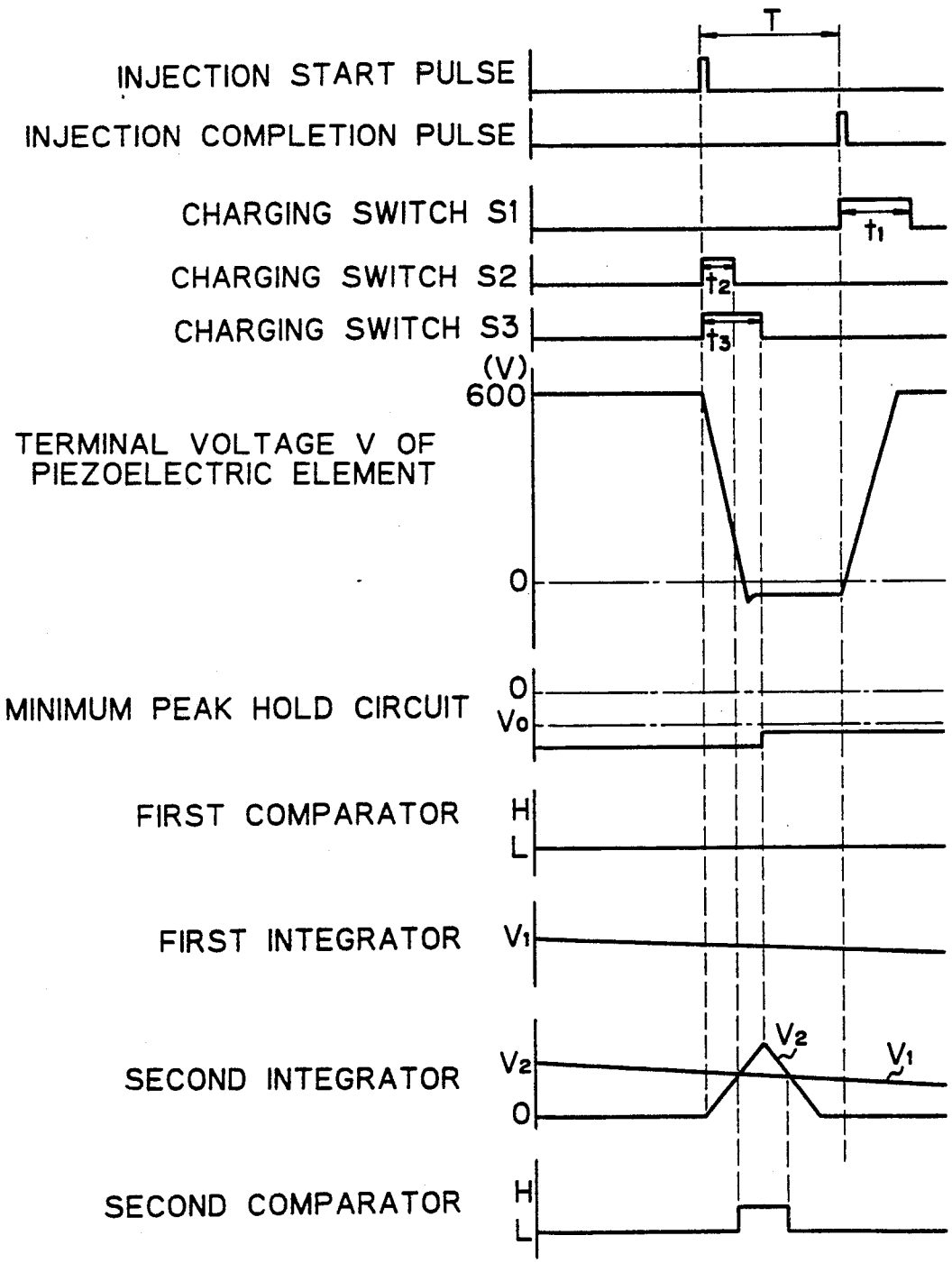
FIG. 8 is a time chart.

The minimum peak hold circuit 51, as shown in FIG. 7, may be reset by using a fall of the output voltage of the monostable multivibrator 23 as a trigger. In this case, the output voltage of the minimum peak hold circuit 51 changes as shown in FIG. 8.

According to the present invention, the terminal voltage of the piezoelectric element after the completion of the discharging operation can be controlled to any negative voltage or positive voltage.

While the invention has been described by reference to specific embodiments chosen for purposes of illustration, it should be apparent that numerous modifications could be made thereto by those skilled in the art without departing from the basic concept and scope of the invention.

I claim:

1. A device for driving a piezoelectric element, comprising:
   a power condenser having a high voltage side terminal;
   first switching means connected between the piezoelectric element and the high voltage side terminal of said power condenser for charging the piezoelectric element by using a high potential at the high voltage side terminal of said power condenser;
   a first discharging circuit having a discharging coil therein and connected between the piezoelectric element to the ground via said first discharging circuit;
   a second discharging circuit having a discharging coil therein and connected between the piezoelectric element and the high voltage side terminal of said power condenser for discharging the piezoelectric element to the high voltage side terminal of said power condenser via said second discharging circuit; and
   discharge control means coupled to the first and second discharging circuits for discharging the piezoelectric element to the high voltage side terminal of said power condenser via said second discharging circuit after discharging the piezoelectric element to the ground via said first discharging circuit, said discharge control means including means for selectively preventing discharging of the piezoelectric element through the first and second discharging circuits.

2. A device according to claim 1, wherein the high voltage side terminal of said power condenser is connected to a constant voltage source to charge said power condenser.

3. A device according to claim 1, wherein a charging coil is serially connected to said first switching means.

4. A device according to claim 1, wherein a diode forming a forward direction from said charging coil to said piezoelectric element is connected between said charging coil and said piezoelectric element.

5. A device according to claim 1, wherein the discharging coil of said first discharging circuit and the discharging coil of said second discharging circuit are formed by the same discharging coil.

6. A device according to claim 1, wherein a diode forming a forward direction from the discharging coil of said first discharging circuit to the ground is connected between the discharging coil of said first discharging circuit and the ground.

7. A device according to claim 1, wherein a diode forming a forward direction from the discharging coil of said second discharging circuit to the high voltage side terminal of said power condenser is connected between the discharging coil of said second discharging circuit and the high voltage side terminal of said power condenser.

8. A device according to claim 1, wherein said discharge control means is provided with a second switching means provided in said first discharging circuit and a third switching means provided in said second discharging circuit, said discharge control means including means for determining when said piezoelectric element is discharged, wherein said discharge control means operates to turn said second switching ON when said piezoelectric element is discharged, and wherein said discharge control means operates to turn said third switching ON before said second switching means is turned OFF, and said third switching means being turned OFF after said second switching means is turned OFF.

9. A device according to claim 8, wherein said second switching means and said third switching means are simultaneously turned ON when said piezoelectric element is discharged.

10. A device according to claim 8, wherein said discharge control means includes means for determining the time which has elapsed after said second switching means is turned ON, said discharge control means operating to turn said third switching means ON when a predetermined time has elapsed.

11. A device according to claim 8, wherein said discharge control means includes means for determining when said piezoelectric element is discharging, said discharge control means operating to turn said second switching means OFF during the discharging operation of said piezoelectric element, said discharge control means operating to turn said third switching means OFF after the discharging operation of said piezoelectric element is completed.

12. A device according to claim 11, wherein said discharge control means is provided with a monostable multivibrator for driving said second switching means and a monostable multivibrator for driving said third switching means, said second switching means being turned ON only for a time determined by the corresponding monostable multivibrator and said third switching means being turned ON only for a time determined by the corresponding monostable multivibrator.

13. A device according to claim 11, wherein said discharge control means is provided with a driving control means, said device including means for determining a terminal voltage of said piezoelectric element and means for comparing the terminal voltage with a predetermined voltage, and wherein said driving control means drives said second switching means in response to the terminal voltage of said piezoelectric element and said driving control means is responsive to the monostable multivibrator for driving said third switching means, said second switching means being turned ON while the terminal voltage of said piezoelectric element falls to the predetermined voltage and said third switching means being turned ON only for a time determined by said monostable multivibrator.

14. A device according to claim 13, wherein said driving control means is provided with a pair of resistive elements connected between the terminals of said piezoelectric element and wherein said device includes means for determining a voltage at the node of said resistive elements and wherein said second switching means is turned ON while a voltage at the node of said pair of resistive elements falls to a predetermined voltage.

15. A device according to claim 13, wherein said driving control means is provided with a comparator for comparing the terminal voltage of said piezoelectric element with said set voltage and wherein said driving control means includes a bistable multivibrator for turning ON said second switching means while the terminal voltage of said piezoelectric element falls to said set voltage based on the output of said comparator.

16. A device according to claim 11, wherein said discharge control means is provided with a detecting means for detecting the terminal voltage of said piezoelectric element after the completion of the discharging operation, means for determining a terminal voltage of said piezoelectric element and means for comparing the terminal voltage with a predetermined voltage, a driving control means for driving said second switching means so that the terminal voltage of said piezoelectric element after discharge becomes the predetermined voltage and a monostable multivibrator for driving said third switching means whereby said third switching means is turned ON only for a time determined by said monostable multivibrator.

17. A device according to claim 16, wherein said detecting means comprises a minimum peak hold circuit for holding the minimum terminal voltage of said piezoelectric element after the discharging operation.

18. A device according to claim 16, wherein said detecting means comprises a minimum peak hold circuit for holding the terminal voltage of said piezoelectric element before the charging of said piezoelectric element is started, after discharging said piezoelectric element.

19. A device according to claim 16, wherein said driving control means is provided with a bistable multivibrator for controlling the ON time of said second switching means, said ON time being made shorter as the terminal voltage of said piezoelectric element after the completion of the discharging operation becomes lower than said set voltage and said ON time being made longer as the terminal voltage of the piezoelectric element after the completion of the discharging operation becomes higher than said set voltage.

20. A device according to claim 19, wherein said driving control means is provided with a first comparator and a second comparator and a first integrator connected to an output terminal of the first comparator, said driving control means further including a second integrator connected to an output terminal of said monostable multivibrator, and wherein a non-reversing input terminal of said first comparator is connected to an output terminal of said detecting means and a reversing input terminal of said first comparator is connected a reference power source, wherein a non-reversing input terminal of said second comparator is connected to an output terminal of said first integrator and a reversing input terminal of said second comparator is connected to an output terminal of said second integrator and wherein said bistable multivibrator is controlled based on an output of said second comparator.

* * * * *

UNITED STATES PATENT AND TRADEMARK OFFICE
CERTIFICATE OF CORRECTION

PATENT NO. : 5,208,505
DATED : May 4, 1993
INVENTOR(S) : Masaki MITSUYASU

It is certified that error appears in the above-identified patent and that said Letters Patent is hereby corrected as shown below:

Column 2, line 2, after "Namely" insert a comma.

Column 3, line 2, after "started" delete the comma and insert a semi-colon.

Column 3, line 34, after "be" delete the comma.

Column 4, line 18, change "to flow caused" to --caused to flow--.

Column 4, line 29, change "sometime" to --some time--.

Column 12, line 60, after "connected" insert --to--.

Signed and Sealed this

First Day of March, 1994

Attest:

BRUCE LEHMAN

Attesting Officer

Commissioner of Patents and Trademarks